United States Patent [19]

Osakabe et al.

[11] Patent Number: 5,613,552
[45] Date of Patent: Mar. 25, 1997

[54] COOLING APPARATUS USING BOILING AND CONDENSING REFRIGERANT

[75] Inventors: Hiroyuki Osakabe, Chita-gun; Kiyoshi Kawaguchi, Toyota; Masahiko Suzuki, Hoi-gun, all of Japan

[73] Assignee: Nippondenso Co., Ltd., Kariya, Japan

[21] Appl. No.: 501,718

[22] Filed: Jul. 12, 1995

[30] Foreign Application Priority Data

Jul. 13, 1994 [JP] Japan .................................. 6-160992

[51] Int. Cl.⁶ .................................................. F28D 15/00
[52] U.S. Cl. ........................ 165/104.21; 165/104.33; 165/80.3; 257/715; 257/722; 361/690; 361/697; 361/700
[58] Field of Search .............................. 165/104.33, 80.3, 165/104.21; 361/703, 700, 697, 690; 257/715, 722

[56] References Cited

U.S. PATENT DOCUMENTS

| | | | |
|---|---|---|---|
| 3,476,175 | 11/1969 | Plevyak | 165/104.33 |
| 3,682,237 | 8/1972 | Islo | 165/104.33 X |
| 3,741,292 | 6/1973 | Aakalu et al. | 165/104.33 |
| 4,027,728 | 6/1977 | Kobayashi et al. | 361/700 X |
| 4,369,838 | 1/1983 | Asanuma et al. | 361/703 X |
| 4,549,603 | 10/1985 | Shirai et al. | 165/104.33 |
| 4,705,102 | 11/1987 | Kanda et al. | 165/104.33 |
| 4,765,397 | 8/1988 | Chrysler et al. | 361/703 X |
| 4,953,058 | 8/1990 | Harris | 361/703 X |
| 5,105,336 | 4/1992 | Jacoby et al. | 361/703 X |
| 5,168,919 | 12/1992 | Berenholz et al. | 165/104.33 X |

FOREIGN PATENT DOCUMENTS

| | | | |
|---|---|---|---|
| 3132112 | 3/1982 | Germany | 361/700 |
| 59-20640 | 2/1984 | Japan . | |
| 63-45004 | 11/1988 | Japan . | |
| 2278896 | 11/1990 | Japan | 361/690 |
| 3231496 | 10/1991 | Japan | 361/703 |
| 4225791 | 8/1992 | Japan | 165/104.33 |
| 4332196 | 11/1992 | Japan | 361/690 |
| 5326774 | 12/1993 | Japan . | |
| 6104583 | 4/1994 | Japan | 361/697 |
| 1295192 | 3/1987 | U.S.S.R. | 165/104.33 |
| 2202681 | 9/1988 | United Kingdom | 361/697 |

*Primary Examiner*—John Rivell
*Assistant Examiner*—Christopher Atkinson
*Attorney, Agent, or Firm*—Cushman, Darby & Cushman

[57] ABSTRACT

A power pack is mounted on the side wall of a refrigerant tank in which the internal pressure is reduced and a refrigerant is held in such a way that a heat transfer panel on which a power element is mounted can contact the refrigerant. The refrigerant boiled and gasified by heat from the contact part of the heat transfer panel 19 is guided into a radiation part planted on the top of the refrigerant tank 11. The radiation part is composed of a plurality of hollow tubular bodies having flat cross sections. The plurality of radiation tubes are laid out in parallel with each other at specified intervals, the upper ends thereof being closed and the lower ends thereof being open to the inside of the refrigerant tank so that the gasified refrigerant is guided thereinto. Here, the natural convection of the air is generated in the up/downward directions by the plurality of radiation tubes, and the effective heat radiation is achieved thereby.

3 Claims, 12 Drawing Sheets

COOLING APPARATUS USING BOILING AND CONDENSING REFRIGERANT

CROSS REFERENCE TO RELATED APPLICATIONS

This application is based upon and claims priority from Japanese Patent Application No. Hei 6-160992 filed on Jul. 13, 1994, with the contents of the document being incorporated herein by reference.

BACKGROUND OF THE INVENTION

1. Field of the Invention

The present invention generally relates to cooling apparatus using boiling and cooling refrigerant. More particularly the present invention relates to a cooling apparatus effectively used for cooling a heating element, such as power element like IGBT(Insulated-Gate Bipolar Transistor), composing a power control unit, such as general-purpose inverter, which cools and liquefies a refrigerant gasified by a heat from the heating element.

2. Description of the Related Art

In a general-purpose inverter for variably controlling the rotational speed of an industrial motor, for example, a power element, such as IGBT, which is a main device composing the circuit of the inverter, is used. As such power element in operation generates a large quantity of heat, a cooling unit is provided in accompaniment to the power element.

Specifically, a power pack accommodating a heating element such as power element therein is mounted on radiation fins composed of materials having a high heat conductivity, such as aluminum, to release the heat generated by the power element. More specifically, the power pack is closely fixed to the radiation fins made of aluminum by bolts or the like, and air flow generated by the radiation fins is flowed to the radiation fins. This forced air cooling apparatus has been employed in many cases. However, when such forced air cooling apparatus is employed, a cooling fan is continuously driven, and this increases the operation cost and the durability, etc. of the motor of the cooling fan become concerns. In order to solve these problems, it is conceivable to remove the cooling fan. However, without the cooling fan, the heat radiation ability would degrade and alternatively it would be required to enlarge the physical frame of the radiation fins.

SUMMARY OF THE INVENTION

It is a primary object of the present invention to provide a cooling apparatus which can highly efficiently release the heat into the atmosphere from the radiation part by such an arrangement that the refrigerant is boiled by the heat from the heating element and the temperature of the radiation part is set to be comparatively high, and thereby the structure can sufficiently be simplified and the high durability can be achieved.

As one preferred mode of a cooling apparatus of the present invention, the present invention provides a cooling apparatus for cooling a heating element including; a refrigerant tank having a surface for mounting the heating element to be cooled, a plane for mounting a radiation part, the refrigerant tank enclosing a refrigerant to be gasified by a heat generated by the heating element therein;

a radiation part having a plurality of hollow member with flat cross sections disposed at specified intervals to roughly be parallel with each other in longitudinal directions, a part of the plurality of hollow members being attached to the plane for mounting the radiation part of the refrigerant tank and communicated with the refrigerant tank respectively; and a plurality of cooling fins disposed between the respective hollow members at the radiation part and forming air flow passages having introduction openings to introduce air therefrom and exhaust openings to exhaust the introduced air at higher positions than the introduction openings; the cooling fins are so designed that air flow passages can upwardly extend from the plane for mounting radiation part.

In the cooling apparatus so constructed as described above, the heat from the heating element, such as power element, is directly transferred to the refrigerant within the refrigerant tank, the refrigerant is boiled, evaporated and gasified by the heat, and the gasified refrigerant rises through the hollow part of the radiation material. As the temperature of the inside wall of the radiation material is low, the refrigerant vapor which has risen is condensed and liquefied by the release of the heat to the radiation material, and returned into the refrigerant tank in drops. Here, as the radiation material receives the heat from the refrigerant vapor on one hand and has heat radiating function on the other hand, the radiation material radiates the heat received from the refrigerant vapor into the atmosphere. As the hollow part composing the radiation part is vertically disposed against the gravity, the air heated by the heat radiation due to natural convection rises, the radiation material is efficiently cooled, and the boiled and gasified refrigerant is efficiently liquefied. As a result, the cooling of the heating element, such as power element, can efficiently be executed.

DETAILED DESCRIPTION OF THE PREFERRED EMBODIMENTS

Figure 1:
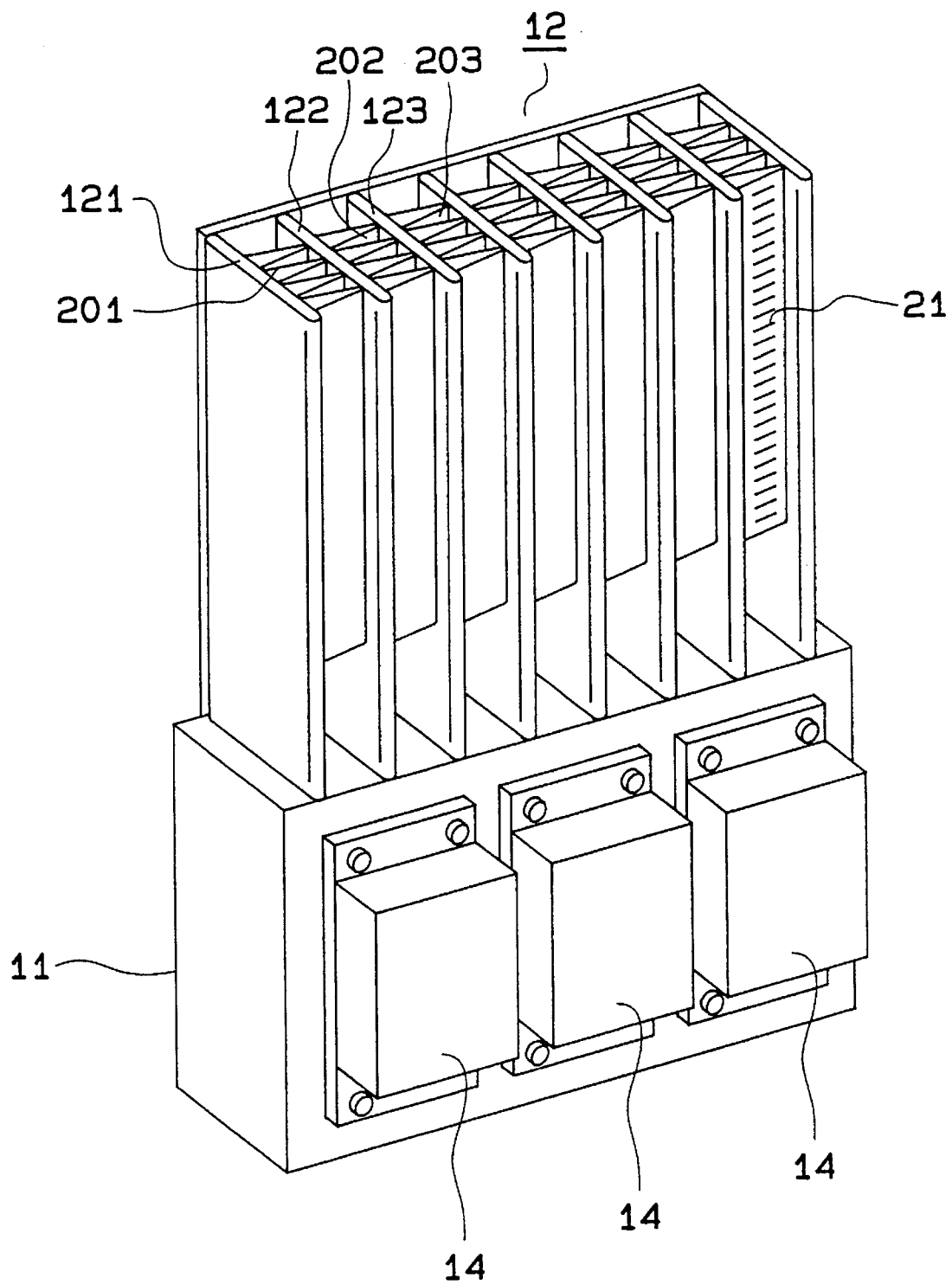
FIG. 1 is a perspective view illustrating a cooling apparatus related to an embodiment according to the present invention.
Figure 2:
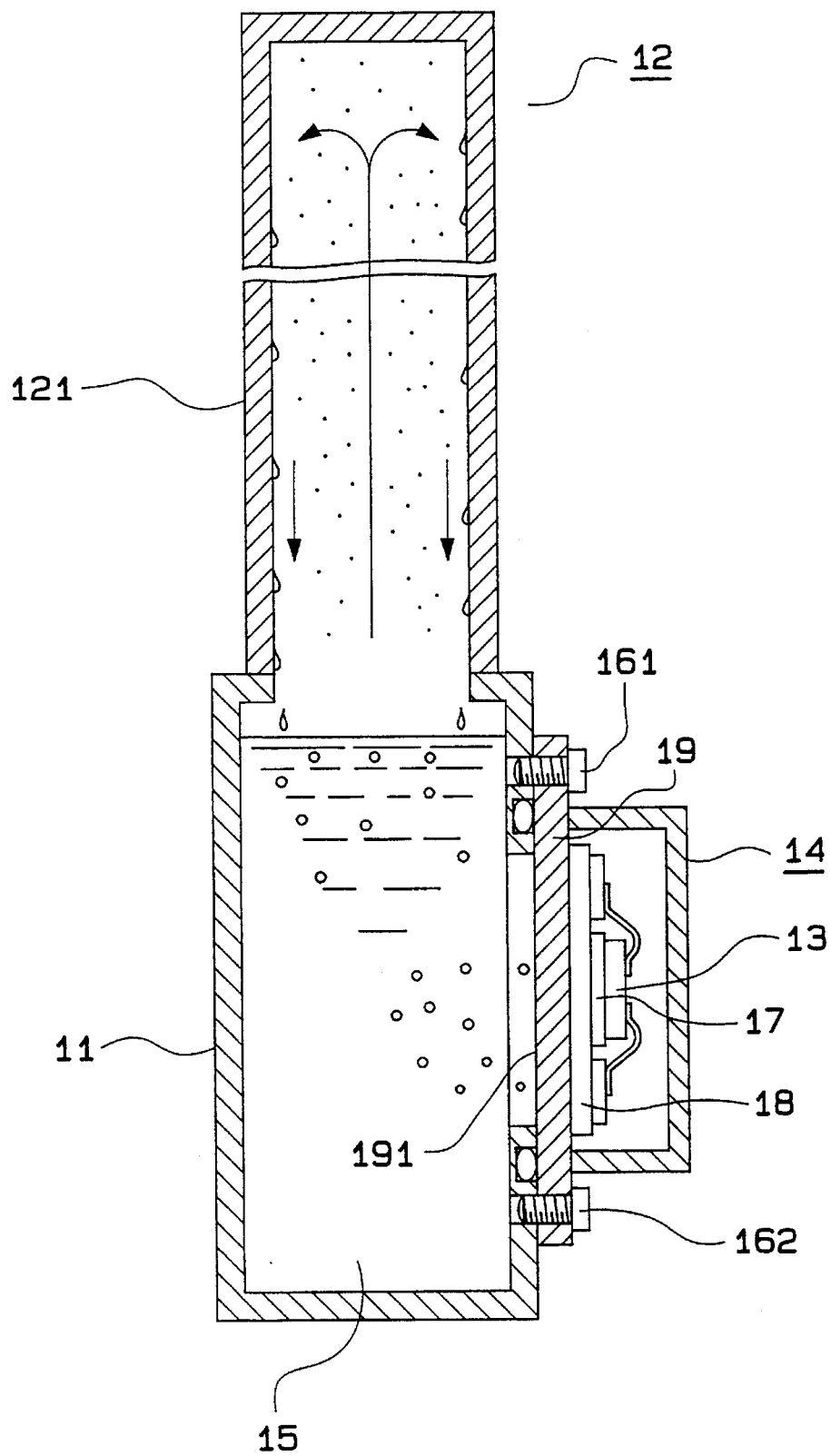
FIG. 2 is a cross sectional view illustrating the cooling apparatus of FIG. 1.

An embodiment according to the present invention will now be described referring to the appended drawings. FIGS. 1 and 2 illustrate the construction of a cooling apparatus which includes a refrigerant tank 11 and a radiation part 12 composed of a plurality of radiation tubes 121, 122, 123 formed integrally with the refrigerant tank 11. A power pack 14 equipped with a power element 13 composed of a semiconductor element such as IGBT, composing a general-purpose inverter, for example, is mounted to a side wall part of the refrigerant tank 11. In the refrigerant tank 11, a refrigerant 15, such as water, is enclosed. An inside of the refrigerant tank 11 is set to a low-pressure state through pressure reduction to lower the boiling point of the refrigerant 15. The refrigerant tank 11 is made of a metal, such as aluminum plate and rolled copper plate, or a resin.

The power pack 14 is fixedly mounted to the front wall surface of the refrigerant tank 11 by bolts 161, 162 for example. The power element 13 is bonded to a DBC (direct bonding copper) by soldering or the like, the DBC 17 is bonded to an insulative substrate 18 by brazing or the like, and the insulative substrate 18 is bonded to a heat transfer plate 19 by soldering.

The insulative substrate 18 is made of a material having a high heat conductivity and a high electric insulation ability, such as AlN (Aluminium Nitride). The heat transfer plate 19 is made of a material having a high heat conductivity, such as copper. The back surface of the heat transfer plate 19 in opposition to the surface thereof for mounting the power element 13 directly contacts the refrigerant 15 sealed in the refrigerant tank 11.

The radiation tubes 121, 122, 123 composing the radiation part 12 are made of a plate material having a high heat conductivity, such as copper, and formed into hollow tubular bodies having flat cross sections respectively and vertically planted in the top wall surface of the refrigerant tank 11 so that the flat surface thereof can be set in parallel with each other at specified intervals. Here, the upper ends of the respective radiation tubes 121, 122, 123 are closed, while the lower ends thereof are opened to the inside of the refrigerant tank 11. Furthermore, radiation fins 201, 202, 203 made of plate materials having a high heat conductivity and corrugated are mounted between the respective radiation tubes 121, 122, 123 by brazing.

In the cooling apparatus constructed as described above, when the power element 13, a cooling object, generates heat, the heat is transferred to the heat transfer plate 19 particularly through the DBC 17 and the insulative substrate 18 to a radiation surface 191 which is in contact with the refrigerant 15, and the refrigerant 15 in contact with the radiation surface 191 is boiled and gasified by the transferred heat. At this time, a highly efficient heat transfer is executed by the boiling of the refrigerant 15 between the refrigerant 15 and the radiation surface 191 of the heat transfer panel 19. Heat transfer rate when the refrigerant 15 is in boiling is 100 to 1000 times as high as the heat transfer rate when the refrigerant 15 is in natural convection.

By the boiling of the refrigerant 15 at the radiation surface 191, the refrigerant 15 changes the physical state thereof from liquid to vapor. The vapor as a result of the boiling and gasification of the refrigerant 15 enters the radiation tubes 121, 122, 123 composing the radiation part 12 from the top of the refrigerant tank 11, rises therethrough, and as indicated by arrows in FIG. 2, circulates within the internal hollow passages of the respective radiation tubes 121, 122, 123. Here, as the outer peripheral surfaces of the respective radiation tubes 121, 122, 123 are in contact with the atmosphere and cooled therefore, when the risen vapor contacts the inside surfaces of the respective radiation tubes 121, 122, 123, the vapor is condensed and liquefied, radiating heat. The heat transfer rate when the vapor is in condensation is as high as the heat transfer rate when the refrigerant 15 is in boiling, and therefore a highly efficient heat transfer is executed.

In this way, the radiation tubes 121, 122, 123 receive heat from the vapor and raise the temperature thereof. Having the function of radiation fins as well, these radiation tubes 121, 122, 123 discharge the received heat into the atmosphere by means of natural convection. Here, the radiation tubes 121, 122, 123 have flat cross sections respectively and vertically planted in the top of the refrigerant tank 11 so that the respective flat planes can be arranged in parallel with each other at specified intervals. In this arrangement, the air which has received the heat from the outer peripheral surfaces of the respective radiation tubes 121, 122, 123 raises the temperature thereof and rises therebetween, executing the release of the heat into the atmosphere by means of a highly efficient natural convection.

Here, the radiation fins 201, 202, 203 are so arranged that the directions of the air flow passages subjected to the bending curves and formed to the wave forms extending in the axial directions of the respective radiation tubes 121, 122, 123, i.e., in the up/down directions, and agree with the directions of the aerial natural convection caused to the outer peripheral surfaces of the radiation tubes 121, 122, 123.

In this case, the construction in which the radiation fins 201, 202, 203 are arranged at a high density to enlarge the radiation surfaces thereof poses a problem that the radiation fins 201, 202, 203 are laid out at a too high density for normal natural air cooling and consequently a sufficient radiation effect can not be achieved so easily. However, when the temperatures of the radiation tubes 121, 122, 123 can be raised by the heat radiation due to the boiling and cooling of the refrigerant 15 as embodied in this embodiment, the heat radiation by means of natural convection at a high efficiency can be achieved.

In the cooling apparatus so constructed as described above, the temperatures of the radiation tubes composing the radiation part 12 for releasing the heat into the atmosphere can be set to be high by means of the boiling and condensation of the refrigerant 15 having a high heat transfer rate. Accordingly, the temperature differences between the respective radiation tubes 121, 122, 123 and the atmosphere can be set to be large. As a result, a larger heat quantity can be released, and the simplification of the construction and reduction of the manufacturing can be achieved with ease.

In the conventional, general structure of radiation, a heating element is mounted to aluminum radiation fins. However, as this construction can not sufficiently raise the temperatures of the radiation fins, the areas of the respective radiation fins should be enlarged or forced air cooling by means of a cooling fan should be employed. Nevertheless, if the areas of the respective radiation fins are enlarged, the physical frame of the cooling apparatus would inevitably become very large. On the other hand, if the forced air cooling by means of a cooling fan is employed, the cooling fan and a mechanism for driving thereof would be additionally provided, which would lead to the higher manufacturing cost and lower durability of the cooling apparatus.

In this regard, by constructing the apparatus according to this embodiment, the temperatures of the radiation tubes 121, 122, 123 can easily be set to be high due to a high heat transfer rate by means of the boiling of the refrigerant 15. Therefore, it is possible to achieve an efficient air cooling by means of natural convection within a small frame of body.

Furthermore, the radiation fins 201, 202, 203 used in this embodiment may be constructed by simply bending metal plates into wave forms to obtain the intended effect. If a plurality of louvers 21 are formed by cutting and raising the surfaces corrugated into wave forms, the front edge effects of the louvers 21 can improve the average heat transfer rate and further increase in radiation quantity can be expected.

Figure 3:
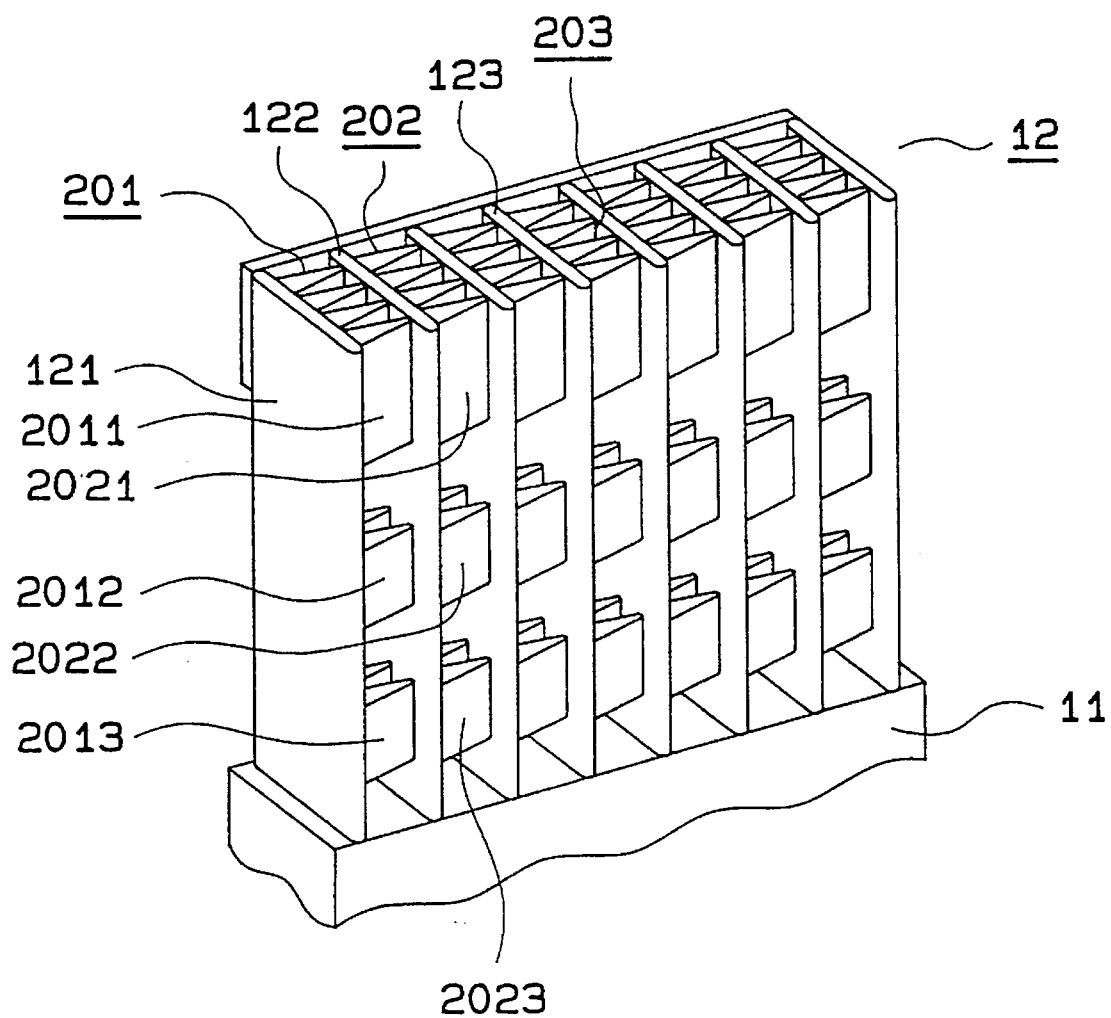
FIG. 3 is a partial perspective view illustrating the second embodiment according to the present invention.

According to the second embodiment illustrated in FIG. 3, the radiation fins 201, 202, 203 are set in correspondence with the respective radiation tubes 121, 122, 123, and the radiation fins 201, 202, 203 are composed of respective split radiation fins 2011, 2012, 2013, 2021, 2022, 2023. Then, the air warmed in the lower part of the radiation tubes 121, 122, 123 is discharged into the atmosphere from the side parts before reaching the upper parts thereof. As a result, the cooling effect of the radiation fins 201, 202, 203 can further be raised, and the performance as a cooling apparatus can be improved.

In the above case where the radiation fins 201, 202, 203 are split in the up/down directions into the radiation fins 2011, 2012, 2013, 2021, 2022, 2023, if the flows of the air warmed in the lower parts are efficiently controlled, the effect of the present invention will further be improved.

Figure 4:
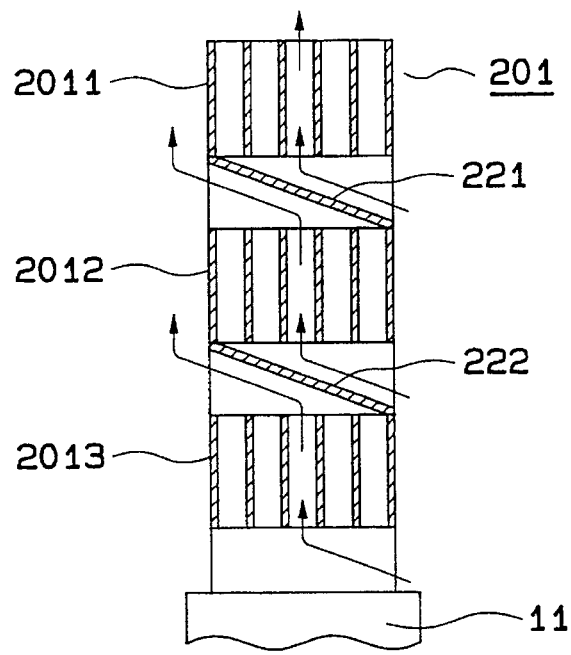
FIG. 4 is a partial cross sectional view illustrating the third embodiment according to the present invention.

FIG. 4 illustrates the third embodiment, in which inclined guide panels 221, 222 are disposed between the respective split radiation fins 2011, 2012, 2013. In this arrangement, the air which has flowed throughout the split radiation fin 2013 further flows along the guide panel 222 and is backwardly (for example) discharged, so that the air from the front is guided by the guide panel 222 into under the split radiation fin 2012 above the split fin 2013; the warmed heat from above the split radiation fin 2012 is guided by the guide panel 221 and backwardly discharged therefrom; and the air guided from the front is guided to under the split radiation fin 2011 above the split radiation fin 2012.

In short, the natural convection passages of the air with respect to the radiation tubes 121, 122, 123, the radiation fins 201, 202, 203 composing the respective radiation tubes 121, 122, 123 and the split radiation fins 2011, 2012, 2013, 2021, 2022, 2023 splitting the respective radiation fins 201, 202, 203 are clearly distinguished and formed by the guide panels 221, 222, and the air flow passages are formed as indicated by arrows in FIG. 4. As a result, more effective heat radiation can be executed.

Figure 5:
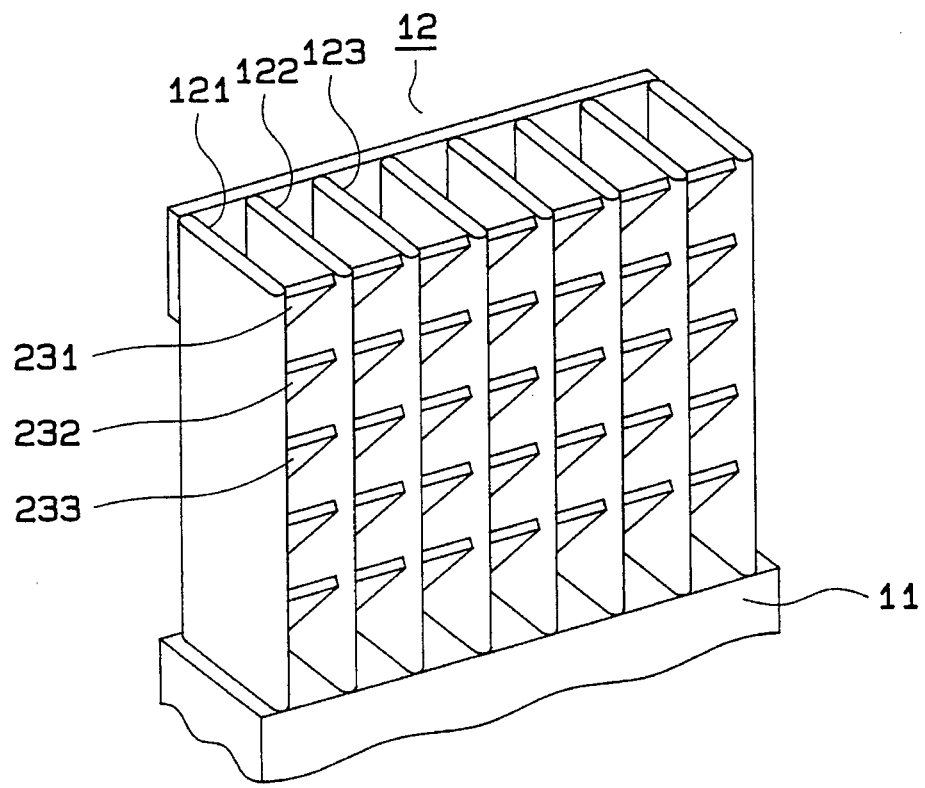
FIG. 5 is a partial perspective view illustrating the fourth embodiment according to the present invention.

According to the fourth embodiment illustrated in FIG. 5, a plurality of radiation fins 231, 232, 233 composed of thin plate materials are arranged between the respective radiation tubes 121, 122, 123 which are planted in the top of the refrigerant tank 11. These radiation fins 231, 232, 233 are laid out in the up/down directions at specified intervals and inclined in the same direction respectively. That is, these radiation fins 231, 232, 233 collectively form a guide structure for air flows crossing from the front to the back, for example, of the radiation part 12 composed of a plurality of radiation tubes 121, 122, 123, setting the air convection passages on the air flow contacting surfaces of the respective radiation fins 231, 232, 233. Accordingly, the radiation fins 231, 232, 233 always receive the inflow of the air of low temperature, and the heat radiation quantity is effectively increased, and the performance as a cooling apparatus can be improved.

Figure 6:
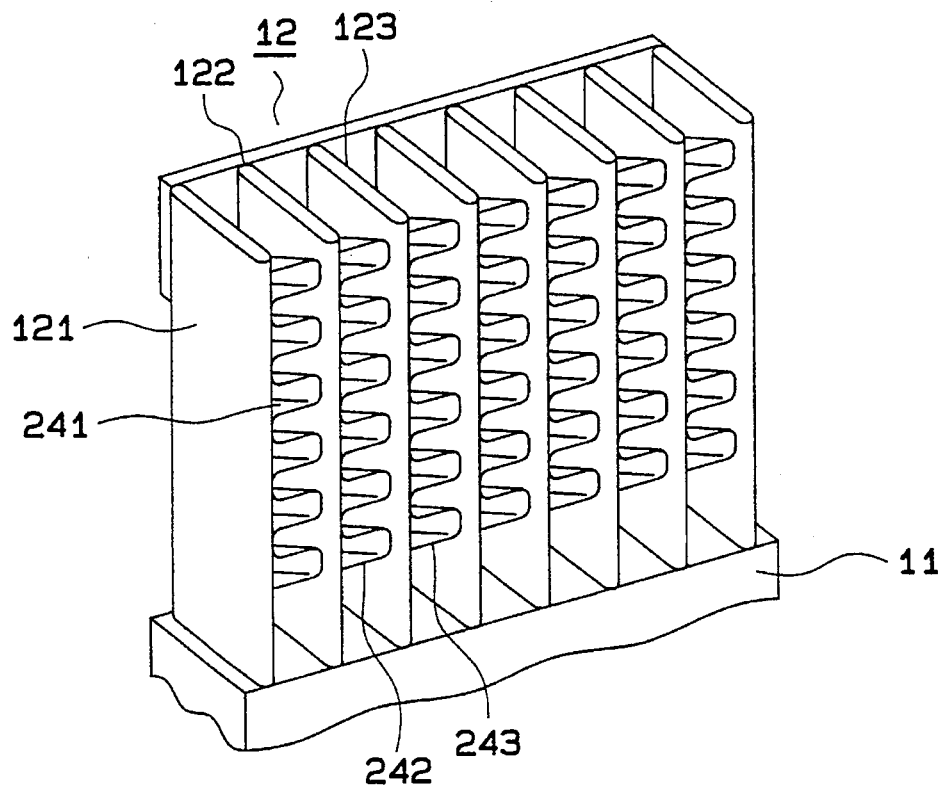
FIG. 6 is a partial perspective view illustrating the fifth embodiment according to the present invention.

According to the fifth embodiment illustrated in FIG. 6, radiation fins 241, 242, 243 made of metal plates having a high heat conductivity and formed into wave forms are interposed between the respective radiation tubes 121, 122, 123 and properly brazed. In this case, the air flow directions along the corrugated lines of the wave forms of the respective radiation fins 241, 242, 243 are set in the inclined forward/backward directions. For example, it is so arranged that the inclined air flow passages are formed from the front side of the radiation part 12 to the backward.

Figure 7:
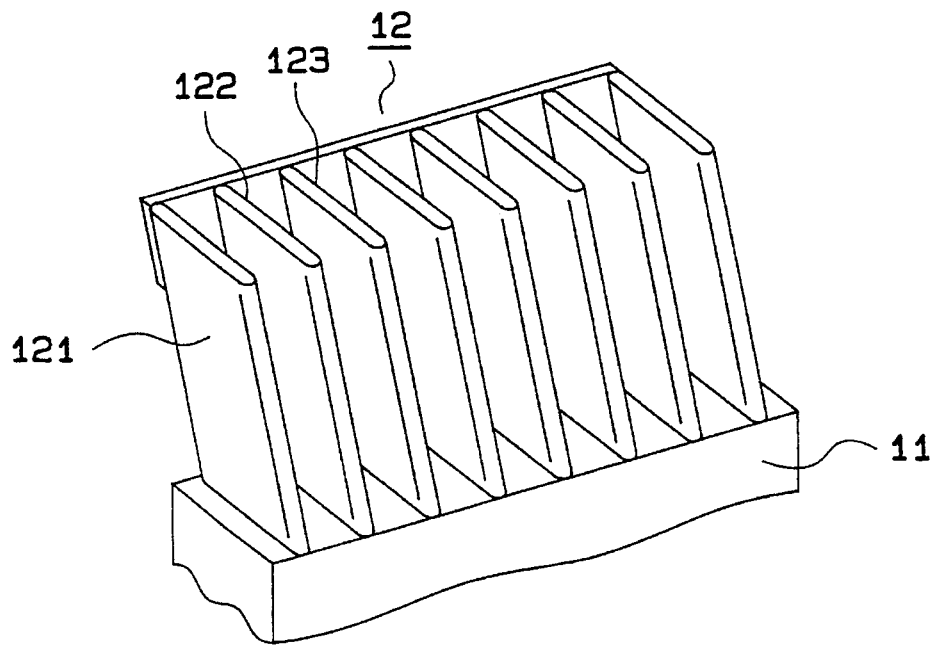
FIG. 7 is a partial perspective view illustrating the sixth embodiment according to the present invention.

In the embodiments so far described, the radiation tubes 121, 122, 123 composing the radiation part 12 are composed of hollow tubular bodies having flat cross sections and vertically planted in the refrigerant tank 11 so that the cross-sectional shapes thereof can be uniform in the vertical direction. As embodied in the sixth embodiment illustrated in FIG. 7, however, the respective radiation tubes 121, 122, 123 may be set in a state slightly inclined to the side surfaces thereof. Even in this construction, the convection air flow passages along the side surfaces of the radiation tubes 121, 122, 123 are formed, and therefore the heat radiation effect can sufficiently be expected at the radiation part 12. (In FIG. 7, radiation fins 201, 202, 203 disposed between the respective radiation tubes 121, 122, 123 are not illustrated.)

In other words, again in the radiation part 12 of this embodiment, the air cooling apparatus by means of natural convection can be realized. Therefore, as the cross-sectional shapes of the radiation tubes 121, 122, 123 in the vertical direction can uniformly be set, the air whose temperature has been raised can rise with no obstacle in the way, and therefore the heat radiation effect at the radiation part 12 can be secured.

Figure 8:
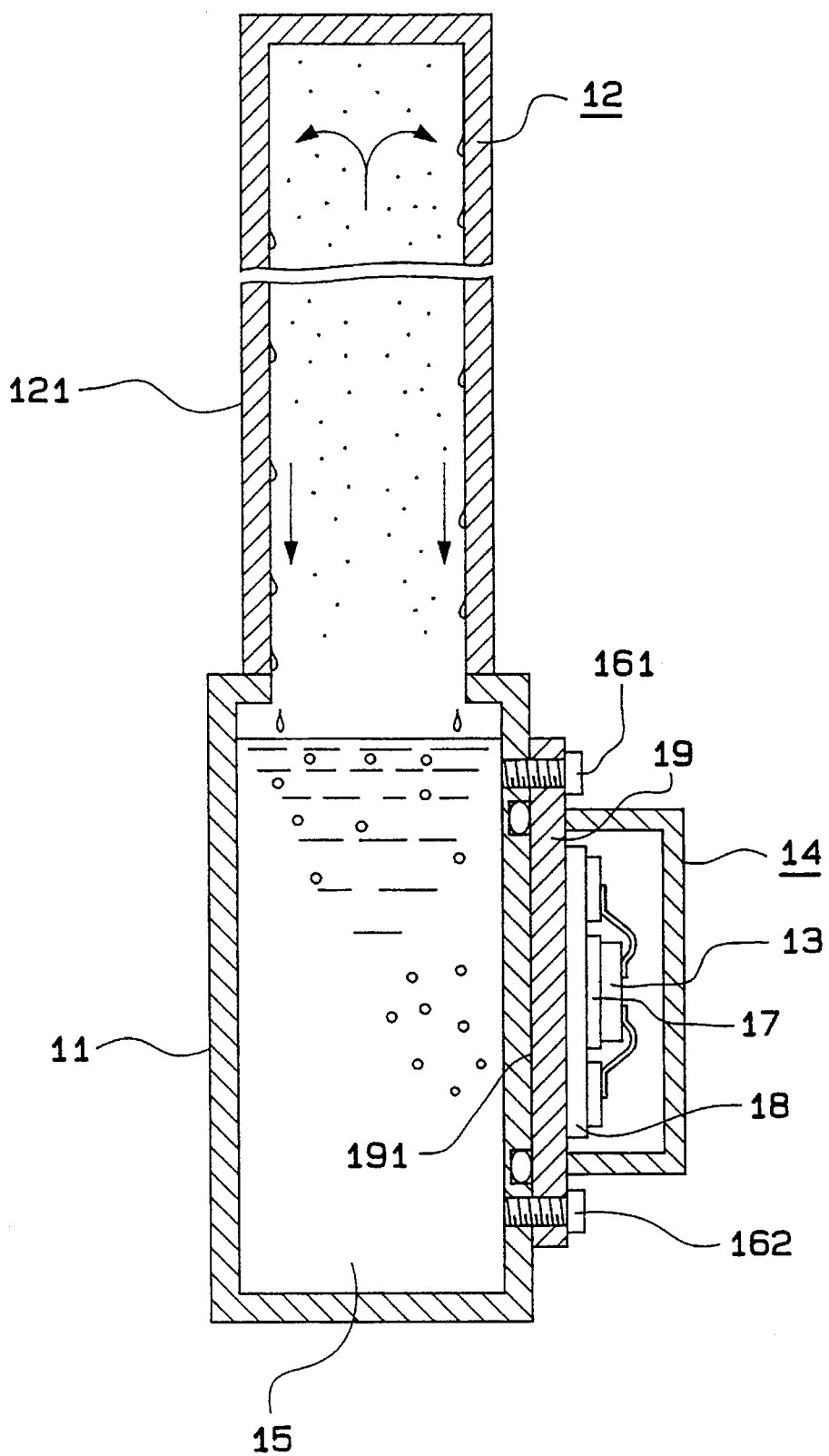
FIG. 8 is a cross-sectional view of the seventh embodiment according to the present invention.

In the seventh embodiment illustrated in FIG. 8, in mounting the power pack 14 to the side wall part of the refrigerant tank 11, it is so arranged that the mounting surface for the power element 13 of the heat transfer plate 19 and the back surface thereof can not directly contact the refrigerant 15 sealed in the refrigerant tank 11. In this construction, in maintenance or inspection of the power pack 14, as the refrigerant 15 is not exposed to the outside, there is no need to execute such a treatment as pressure reduction of the inside again. Therefore, operation efficiency of the maintenance and inspection is high.

Figure 9:
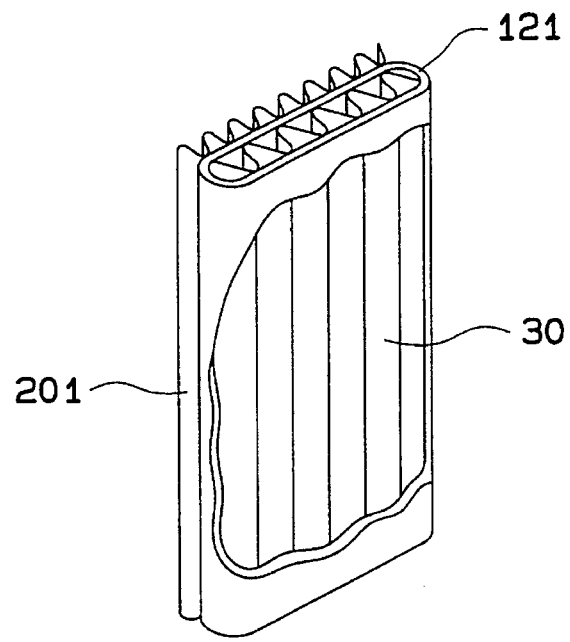
FIG. 9 is a partial cut away perspective view illustrating the eighth embodiment according to the present invention.

In the eighth embodiment illustrated in FIG. 9, inner fins 30 are inserted into the insides of the respective radiation tubes 121, 122, 123. The inner fin 30 is made of metallic materials having a high heat conductivity, such as aluminum and copper, and bonded to the insides of the respective radiation tubes 121, 122, 123 by brazing or soldering. By inserting the inner fin 30 in this way, the condensation area can further be increased, and the heat radiation effect can further be improved.

Figure 10:
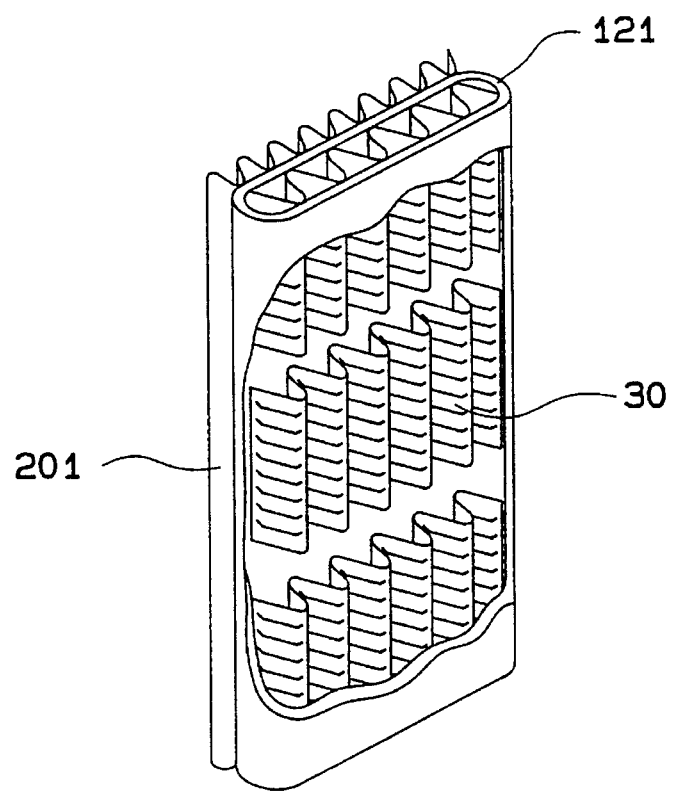
FIG. 10 is a partial cut away perspective view illustrating the ninth embodiment according to the present invention.

In the ninth embodiment illustrated in FIG. 10, respective corrugated louver fins 30 constitute respective inner fins. By this construction, vapor diffusion is caused, and uneven heat distribution in the inside of the radiation tubes 121, 122, 123 can be prevented, the liquid film growth due to the condensation can be restrained by the louvers. As a result, the degradation in the heat radiation ability due to the increase in the heat resistance of the liquid film can be prevented, and the heat radiation ability can further be raised.

Figure 11:
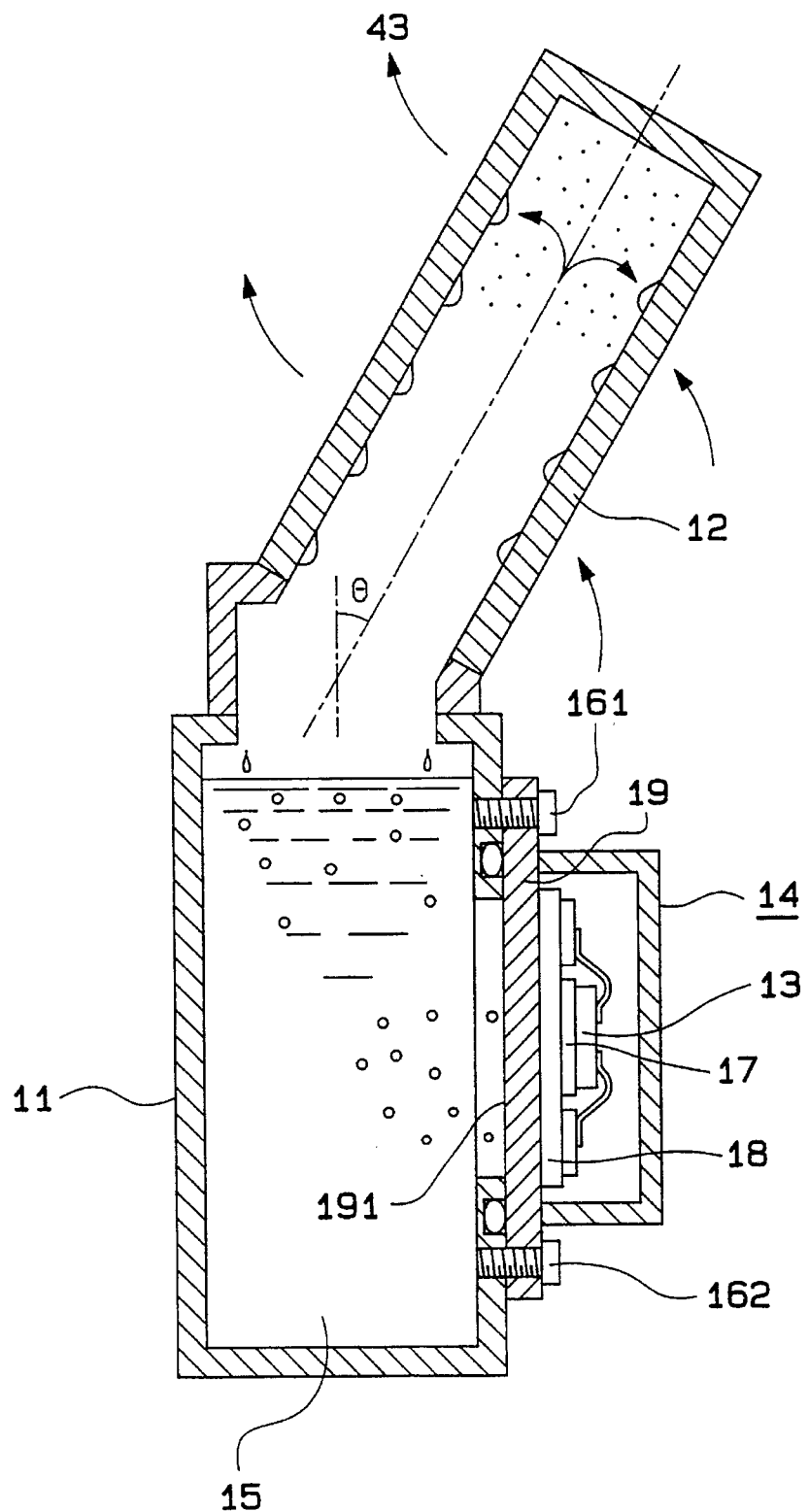
FIG. 11 is a cross sectional view illustrating the tenth embodiment according to the present invention.
Figure 12:
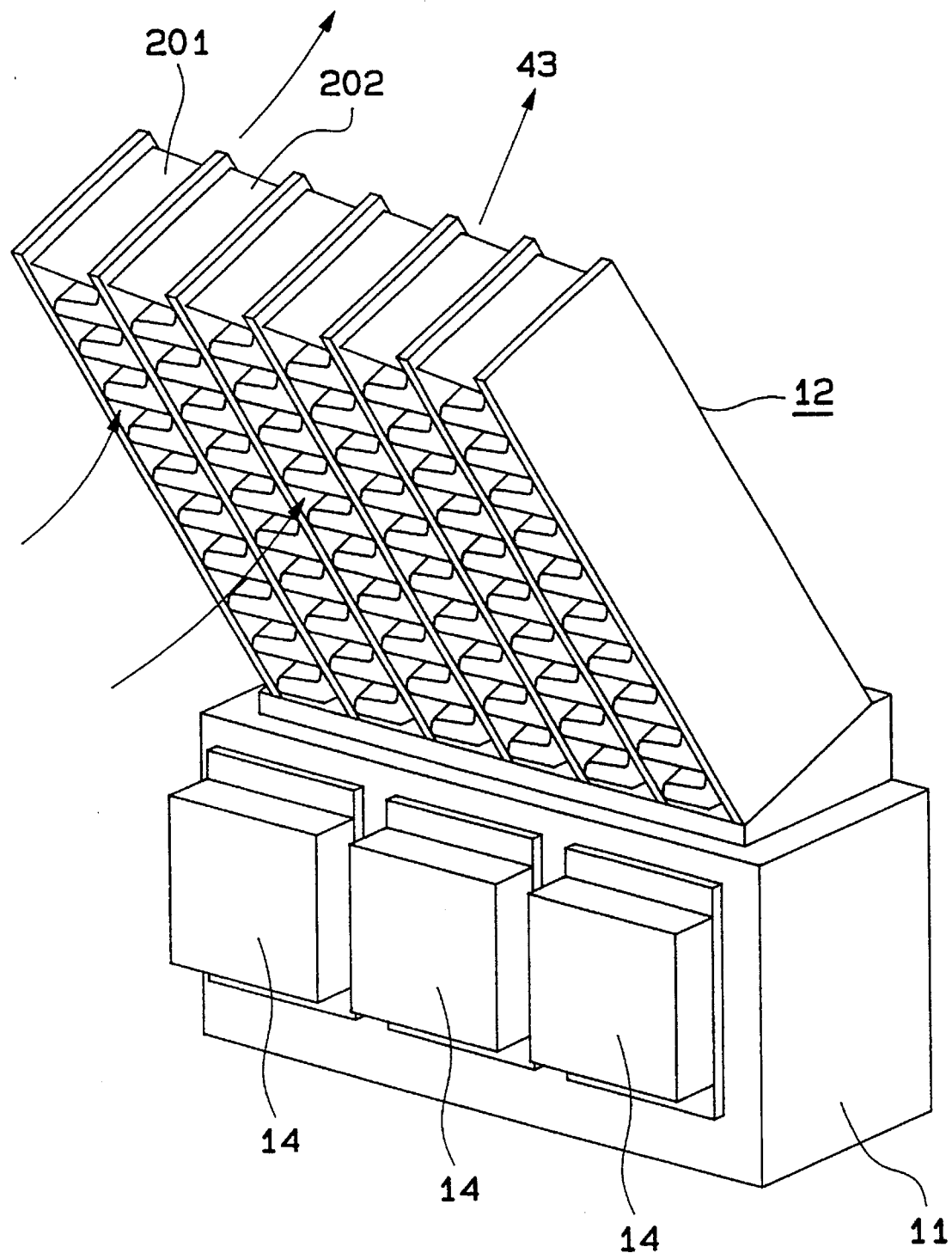
FIG. 12 a perspective view illustrating the tenth embodiment according to the present invention.

FIGS. 11 and 12 illustrate the tenth embodiment. In this embodiment, the refrigerant tube 121 is implanted in the top of the refrigerant tank 11 in the inclined state. Specifically, the radiation tubes 121, 122, 123 vertically planted in the top of the refrigerant tank 11 in the embodiment illustrated in FIGS. 1 and 3 are inclined to the ahead of the power pack 14 mounted on the refrigerant tank 11, and the radiation fins 201, 202, 203 are properly disposed between the respective radiation tubes 121, 122, 123. By disposing the radiation tube 121 in the inclined state, the flow passages of the heat exchanging fluid are inclined at the inclined angle of the radiation tube 121 within the radiation fins 201, 202, 203 disposed between the respective radiation tubes 121, 122, 123. As a result, there is no obstacle in the way of the heat exchange fluid flows from the lower part to the upper part, and the heat radiation effect can be promoted by the air flows indicated by arrows 43.

Figure 13:
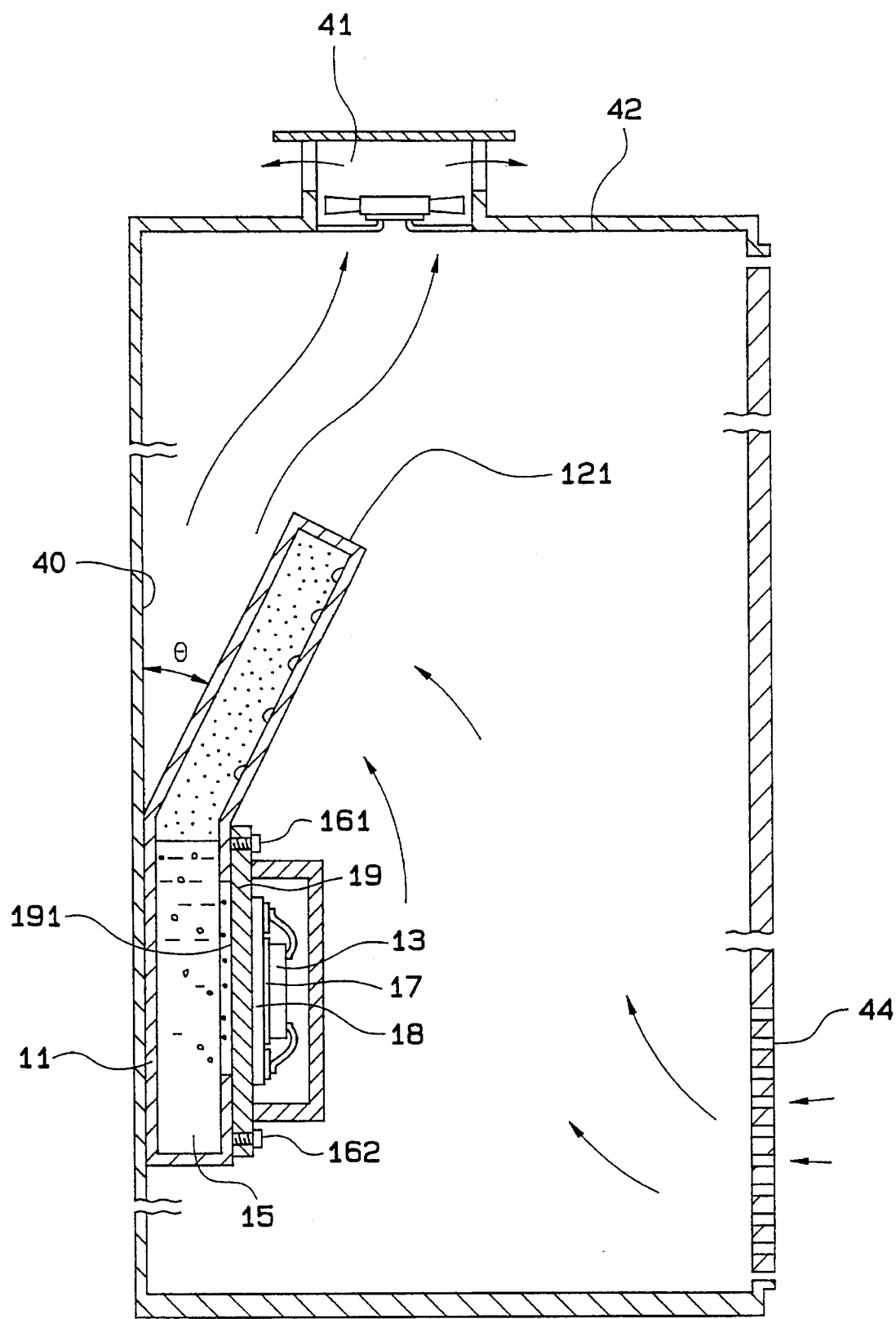
FIG. 13 is a cross sectional view depicting the eleventh embodiment according to the present invention.

FIG. 13 illustrates the cooling apparatus fixedly housed within a control box 42. When an outlet window 41 is formed on the top of the control box 42 and, for example, a inlet window 44 is disposedly formed in correspondence with the front door part, if, for example, the radiation tube 121 is so disposed as to be forwardly inclined separating from a back wall surface 40 of the control box 42, air flow passages are formed by the use of a space between the back wall surface 40 and the radiation tube 121, and thereby radiation effect is promoted.

Figure 14:
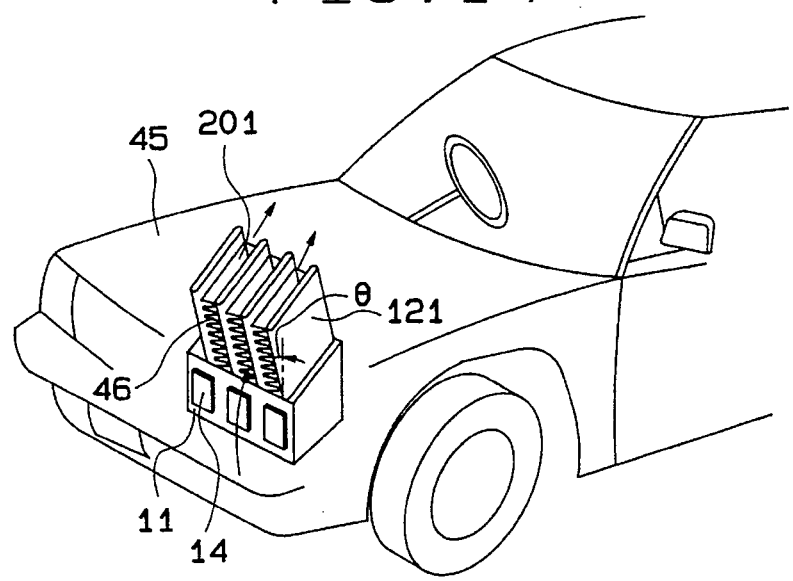
FIG. 14 is a view illustrating the twelfth embodiment mounted on a vehicle according to the present invention.

FIG. 14 illustrates the cooling apparatus fixedly housed within an engine room of a vehicle 45, such as automobile. The radiation tube 121 is fixedly inclined to the refrigerant tank 11 so that the radiation fin 201 can receive the minimum resistance to air while the vehicle 45 is running. By arranging in this way, when the vehicle 45 is in running, more efficient radiation and cooling can be achieved.

Figure 15:
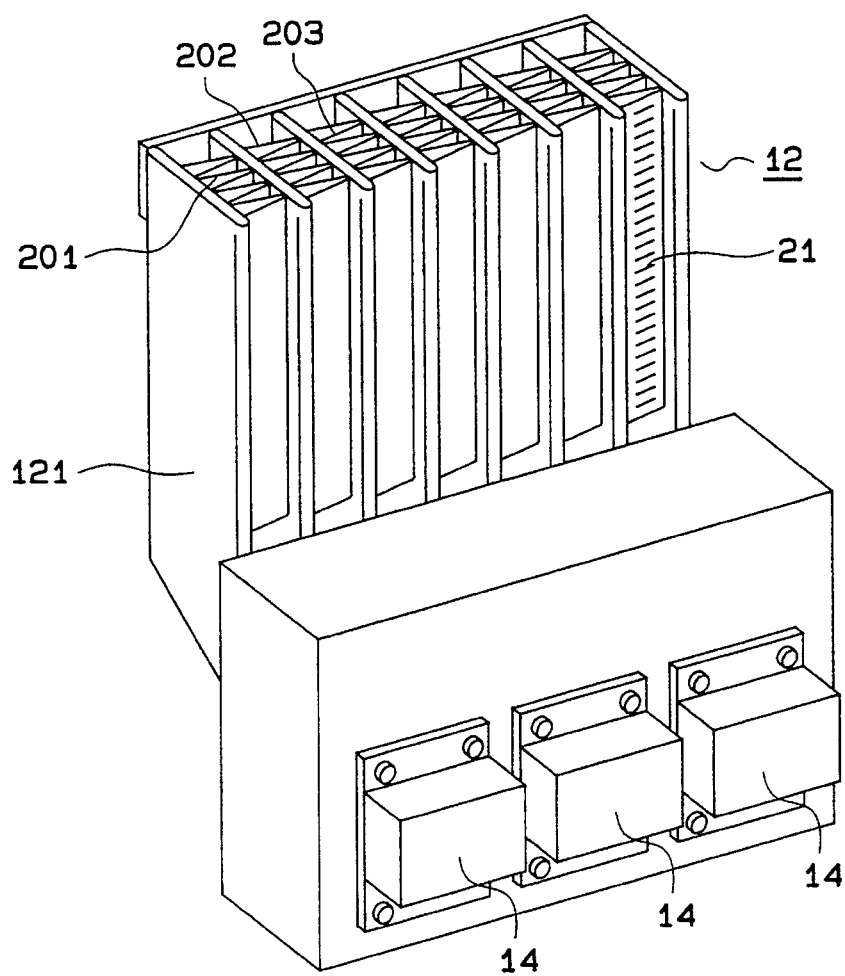
FIG. 15 is a perspective view illustrating the thirteenth embodiment according to the present invention.
Figure 16:
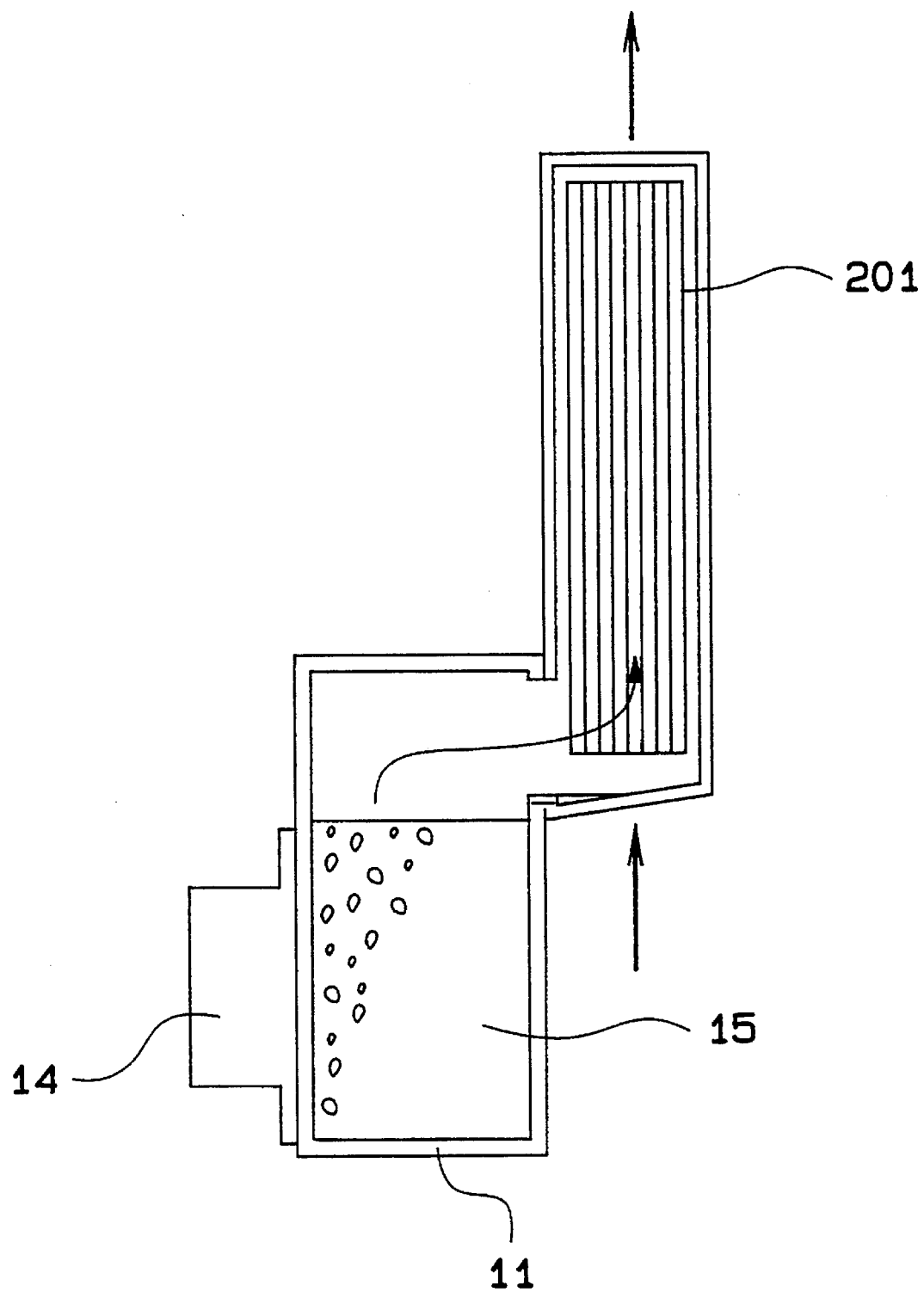
FIG. 16 is a cross sectional view illustrating the thirteenth embodiment.

FIGS. 15 and 16 illustrate the twelfth embodiment. The radiation part 12 is disposed in crank-shape to refrigerant tank 11 to be offsetted. FIG. 16 is a cross sectional view of the cooling apparatus in FIG. 15. Even in this structure, refrigerant 15 gasified by heat reaches the radiation tube 201 of the radiation part 12 through communication passage connecting the refrigerant tank 11 and the radiation part 12. The gasified refrigerant 15 emits its heat and is condensed, so that liquified refrigerant returns to the refrigerant tank 11. In this embodiment, since no obstacles are below the radiation part 12, air flow is not interrupted. The air flow is effectively led into the radiation part 12 from the outside as shown arrows in FIG. 16.

In the cooling apparatus according to the present invention as described above, the refrigerant within the refrigerant tank is boiled by the heat generated by the heating element composed of a power element, such as IGBT, and the thus gasified refrigerant is guided into the radiation tube part composed of the plurality of flat hollow tubular bodies planted in the top of the refrigerant tank. As these plurality of radiation tubes are so designed as to be able to efficiently execute air cooling by means of the natural convection of the air, efficient boiling and cooling can be achieved with a sufficiently simple construction.

What is claimed is:

1. A cooling apparatus for cooling a heating element comprising:
    a refrigerant tank having a surface for mounting said heating element to be cooled, a plane for mounting a radiation part, said refrigerant tank enclosing a refrigerant to be gasified by heat generated by said heating element therein;
    said radiation part having a plurality of hollow members with flat cross sections disposed at specified intervals to roughly be parallel with each other in longitudinal directions, a part of said plurality of hollow members being attached to said plane for mounting said radiation part of said refrigerant tank and communicated with said refrigerant tank respectively; and
    a plurality of cooling fins disposed between said respective hollow members at said radiation part and forming air flow passages having introduction openings to introduce air thereto and exhaust openings to exhaust said introduced air at vertically higher positions than said introduction openings; said cooling fins being so designed that air flow passages can upwardly extend from said plane for mounting said radiation part,
    another group of cooling fins disposed with a predetermined interval from said first group of cooling fins and at an upper position with respect to said first group of cooling fins; and
    a first guide panel disposed between said first and said second groups of cooling fins for leading the air exhausted from said exhaust openings toward a side of said radiation part and a second guide panel disposed between said first guide panel and said refrigerant tank.

2. The cooling apparatus according to claim 1, wherein said plurality of hollow members of said radiation part are disposed so as not to vertically overlay one another.

3. A cooling apparatus for cooling a heating element comprising:
    a refrigerant tank for absorbing high temperature refrigerant, said refrigerant having a plane for mounting a radiation part, said refrigerant tank enclosing a refrigerant to be gasified by a heat by said high temperature refrigerant;
    said radiation part having a plurality of hollow members, a part of said plurality of hollow members being attached to said plane for mounting said radiation part of said refrigerant tank and communicated with said refrigerant tank respectively;
    a plurality of cooling fins disposed between said respective hollow members at said radiation part and forming air flow passages having introduction openings to introduce air thereto and exhaust said introduced air at vertically higher portions than said introduction openings; said cooling fins being so designed that air flow passage can upwardly extend from said plane for mounting said radiation part;
    another group of cooling fins disposed with a predetermined interval from said first group of cooling fins and at an upper position with respect to said first group of cooling fins;
    a first guide panel disposed between said first and said second groups of cooling fins for leading the air exhausted from said exhaust openings toward a side of said radiation part; and
    a second guide panel disposed between said first guide panel and said refrigerant tank.

* * * * *